(12) United States Patent
Durec et al.

(10) Patent No.: US 6,177,832 B1
(45) Date of Patent: Jan. 23, 2001

(54) HIGH FREQUENCY DIFFERENTIAL TO SINGLE-ENDED CONVERTER

(75) Inventors: Jeffrey C. Durec; David Kevin Lovelace, both of Chandler, AZ (US)

(73) Assignee: Motorola, Inc., Schaumburg, IL (US)

(*) Notice: Under 35 U.S.C. 154(b), the term of this patent shall be extended for 0 days.

(21) Appl. No.: 09/110,289

(22) Filed: Jul. 6, 1998

(51) Int. Cl.[7] ....................................................... H03F 3/04
(52) U.S. Cl. .............................................. 327/563; 327/355
(58) Field of Search .................................... 327/560, 563, 327/355, 256, 231; 330/258; 333/109, 110, 112

(56) References Cited

U.S. PATENT DOCUMENTS 5,517,148 * 5/1996 Yin ........................................ 327/563
5,909,129 * 7/1999 Murphy .................................... 327/3

* cited by examiner

Primary Examiner—Dinh T. Le
(74) Attorney, Agent, or Firm—Lanny L. Parker

(57) ABSTRACT

A differential to single-ended converter which combines a pair of applied differential signals of a given frequency applied into a single-ended signal supplied to an output thereof, including capacitive means (14,16 or 36) coupled across a pair of terminals to which the differential signals are applied and transmission line circuitry (18, or 38, 40) coupled across the capacitive means for shifting the phase of one of the differential signals applied to one of the pair of terminals such that it is in phase with the other one of the differential signals applied at the other of the pair of terminals wherein said signals are combined into a single-ended signal and applied to an output of the converter.

12 Claims, 1 Drawing Sheet

US 6,177,832 B1

HIGH FREQUENCY DIFFERENTIAL TO SINGLE-ENDED CONVERTER

BACKGROUND OF THE INVENTION

The present invention relates to a high frequency converter circuit for converting a differential output signal from a differential amplifier to a single-ended output signal and, more particularly, to a high frequency, i.e., frequencies above eight hundred (800) MHz, circuit and method for combining differential output signals into a single-ended signal and simultaneously achieving an impedance match from the differential amplifier and the input of a single-ended output stage.

In many high frequency communications systems it may be necessary to convert differential output signals from a differential amplifier into a single ended signal. For example, in some wireless telephone communication systems operating near or at 900 MHz there is a requirement that a single ended transmission signal be utilized to drive the antenna for transmission. However, typically, differential signals are utilized which requires a converter circuit to derive the single ended signal before it is applied to an input of a single-ended output amplifier stage prior to driving the antenna. Matching of the output impedance of the converter circuit to the input impedance of the output amplifier stage is also required.

In a known prior art differential to single-ended converter one side of the differential outputs of the differential amplifier is simply thrown away, being coupled to ground, while the other output is coupled to the input of the single-ended output amplifier stage. This technique suffers from several disadvantages such as low gain, poor isolation, to name a few. Moreover, the use of an inductor is relatively expensive wherein production cost are desired to be maintained as low as possible.

Hence, a need exists for a low cost improved differential to single-ended converter for converting high frequency differential signals to a single-ended signal and simultaneously achieve impedance matching to a following single-ended stage while eliminating the disadvantages mentioned above with known prior art circuits.

DETAILED DESCRIPTION OF THE PREFERRED EMBODIMENTS

Figure 1:
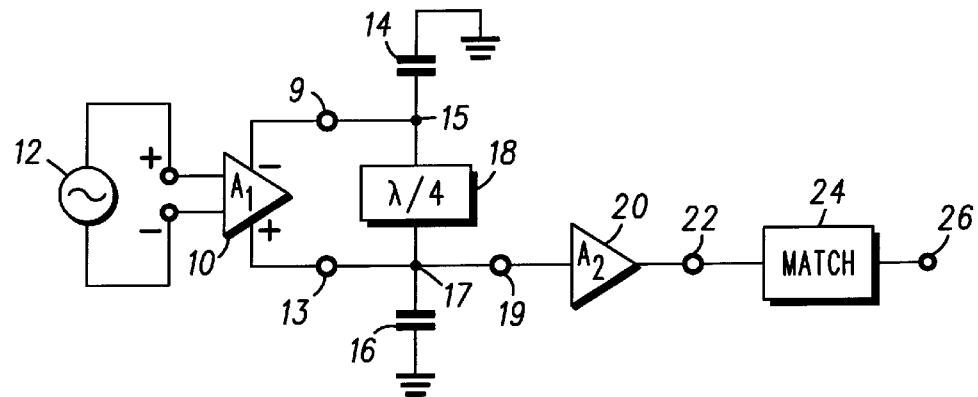
FIG. 1 is a partial block and schematic diagram of one embodiment of the present invention.

Turning now to FIG. 1 there is shown differential amplifier 10 which amplifies the differential output signals supplied from oscillator 12 to the differential inputs thereof. The differential output signals from amplifier 10 are supplied to external outputs 9 and 13. A differential to single-ended converter circuit of one embodiment of the present invention is illustrated comprising capacitors 14 and 16, of generally the same capacitance, which are coupled respectively to the outputs 9 and 13 as well as transmission line 18 coupled between the capacitors 14 and 16 at terminals 15 and 17. The other ends of capacitors 14 and 16 are coupled to a voltage reference potential such as ground. A phase shifting element or transmission line 18, although shown as being a quarter wavelength ($\lambda/4$) transmission line of given characteristic impedance at the given frequency of the differential signals applied at outputs 9 and 13, may be of any odd quarter wavelength multiples of the frequency of the differential signals. An output of the converter is taken at terminal 19 and is applied to the input of externally connected single-ended amplifier stage 20 which amplifies and buffers the single-ended signal from the converter. The amplified single-ended signal is then illustrated as being applied from amplifier stage 20 to the input 22 of a matching stage 24 the output 26 of which may be applied via to an antenna (not shown).

In operation, the differential output signals from amplifier 10 through the load capacitors 14 and 16. Transmission line 18 rotates the phase of the current through capacitor 14 by 180 degrees such that it is now in phase with the current through capacitor 16 and will be combined therewith. Hence, twice the current is now available to drive the input of the single-ended amplifier 20. Thus, the converter circuit of FIG. 1 will have twice the gain of the prior art converter afore described. The converter circuit of FIG. 1 also provides good common mode rejection in that any common mode signals appearing at terminals 9 and 13 are canceled by $\lambda/4$ transmission line 18 causing these signals to be out of phase at output terminal 19.

Additionally, the converter circuit described above provides conjugate matching to the input impedance of amplifier 20. This matching results from the input impedance of single-ended amplifier 20 looking capacitive while the output impedance looking back into the converter is inductive. The equivalent circuit appears as a parallel LC network resonant at the operating frequency. Therefore the gain of the overall circuitry is maximized.

Figure 2:
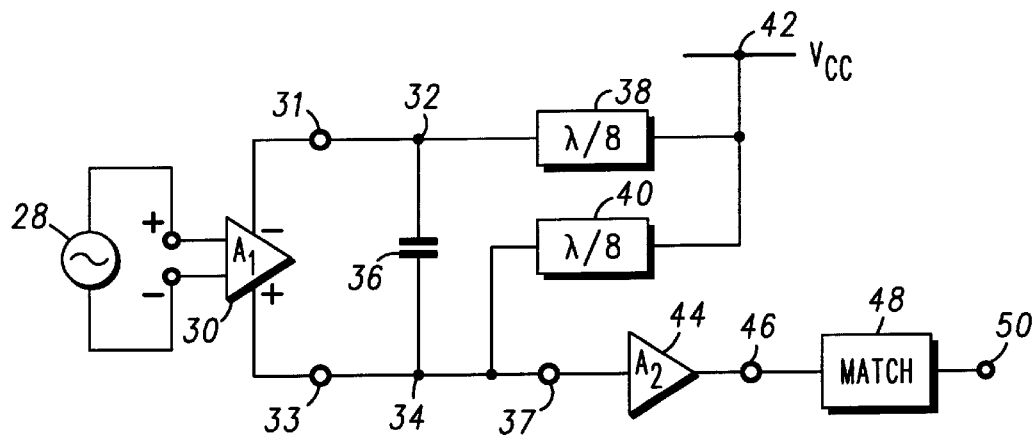
FIG. 2 is a partial block and schematic diagram of another embodiment of the present invention.

Turning to FIG. 2, a corollary converter circuit to that shown in FIG. 1 is illustrated. Once again, a pair of differential output signals are provided by oscillator 28 which are applied to the differential inputs of amplifier 30. Differential amplifier amplifies these signals to provide differential output signals at external output terminals 31 and 33. The converter circuit of the subject embodiment of the invention is shown as including a capacitor 36 the terminals 32 and 34 are coupled to external terminals 31 and 33 and a pair of $\lambda/8$ transmission lines 38 and 40 coupled across capacitor 36 and to a voltage supply, $V_{CC}$, at terminal 42.

Once again, the differential signal applied at output terminal 31 will be shifted in phase through transmission lines 38 and 40 to be in phase with the differential signal applied at terminal 33. The two signals are thus combined into a single-ended signal and applied to the input of single-ended amplifier 44 at terminal 37. Again, the output of amplifier 44 may be supplied at terminal 46 to the input of a matching stage 48 to drive an load at terminal 50.

Although the capacitive impedance is illustrated in the Figures as being realized by physical capacitors 14, and 16 it is well understood to those skilled in the art that open ended transmission line stubs of odd multiples of $\lambda/4$ wavelengths could be used.

Hence, what has been described are a pair of high frequency differential to single-ended converter circuits that provide high gain characteristics, common mode rejection, high linearity and good isolation to other circuits.

What is claimed is:

1. A differential to single-ended converter for combining differential output signals from a differential amplifier having differential outputs into a single-ended output signal at an output of the converter, comprising:

a phase shifting element coupled across the differential outputs of the differential amplifier;

a first capacitive impedance coupled between one of the differential outputs of the differential amplifier and a reference potential;

a second capacitive impedance coupled between the other one of the differential outputs of the differential amplifier and the reference potential; and means for coupling the output of the converter to the one of the differential outputs of the differential amplifier at which the single-ended output signal is provided.

2. The differential to single-ended converter of claim 1 wherein the phase shifting element is a quarter wavelength transmission line.

3. The differential to single-ended converter of claim 2 wherein the first and second capacitive impedances are first and second capacitors respectively.

4. The differential to single-ended output converter of claim 3 wherein a value of the first capacitor is proportional to a value of the second capacitor.

5. A differential to single-ended converter responsive to differential signals applied thereto for providing a single ended signal at an output thereof, comprising:

a capacitive impedance having a first and second terminal across which the differential signals are applied;

a first phase shifting element having an input coupled to the first terminal of the capacitive impedance and a second terminal; and a second phase shifting element having an input coupled to the second terminal of the capacitive impedance and an output coupled to the output of the first phase shifting element, the input of the second chase shifting element also being coupled to the output of the differential to single-ended converter.

6. The differential to single-ended converter of claim 5 wherein the outputs of the first and second phase shifting elements are coupled to a voltage reference potential.

7. The differential to single-ended converter of claim 5 wherein:

the first phase shifting element is a transmission line of one-eighth of a wavelength of a frequency of the applied differential signals; and the second phase shifting element is a transmission line of one-eighth of the wavelength of the frequency of the applied differential signals.

8. A differential to single-ended converter for combining differential signals applied across a pair of terminals into a single-ended signal supplied to an output thereof, comprising:

capacitive means coupled across the pair of terminals; and transmission line circuitry coupled across the capacitive means for shifting a phase of one of the differential signals applied to one of the pair of terminals such that it is in phase with the other one of the differential signals applied at the other of the pair of terminals wherein the signals are combined into a single-ended signal and applied to an output of the converter.

9. The differential to single-ended converter of claim 8 wherein:

the capacitive means includes a first capacitor coupled between one of the pair of terminals and a voltage reference and a second capacitor coupled between the other one of the pair of terminals and the voltage reference; and the transmission line circuitry being a transmission line having an integer fraction of a wavelength of the differential signals.

10. The differential to single ended converter of claim 9 wherein the integer fraction provides a quarter wavelength transmission line.

11. The differential to single-ended converter of claim 8 wherein:

the capacitive means is a capacitor coupled across the pair of terminals; and the transmission line circuitry includes a first transmission line one end of which is coupled to one of pair of terminals and the other end of which is coupled to a voltage potential and a second transmission line one end of which is coupled to the other one of the pair of terminals and the other end of which is coupled to the voltage potential.

12. The differential to single-ended converter of claim 11 wherein the first and second transmission lines are an eighth of a wavelength of the differential signals.

* * * * *

UNITED STATES PATENT AND TRADEMARK OFFICE
CERTIFICATE OF CORRECTION

PATENT NO. : 6,177,832 B1  
DATED : January 23, 2001  
INVENTOR(S) : Jeffrey C. Durec et al.

Page 1 of 1

It is certified that error appears in the above-identified patent and that said Letters Patent is hereby corrected as shown below:

<u>Column 3, claim 5,</u>  
Line 31, delete "chase" and replace with -- phase --.

Signed and Sealed this

Ninth Day of April, 2002

Attest:

*Attesting Officer*

JAMES E. ROGAN  
*Director of the United States Patent and Trademark Office*